US009551597B2

(12) United States Patent
Epperson et al.

(10) Patent No.: US 9,551,597 B2
(45) Date of Patent: Jan. 24, 2017

(54) MEASUREMENT SYSTEM WITH IMAGE CAPTURE CAPABILITIES

(71) Applicant: Fluke Corporation, Everett, WA (US)

(72) Inventors: David Lawrence Epperson, Everett, WA (US); Glen Howard Vetter, Stanwood, WA (US)

(73) Assignee: Fluke Corporation, Everett, WA (US)

( * ) Notice: Subject to any disclaimer, the term of this patent is extended or adjusted under 35 U.S.C. 154(b) by 511 days.

(21) Appl. No.: 13/838,994

(22) Filed: Mar. 15, 2013

(65) Prior Publication Data
US 2014/0267753 A1 Sep. 18, 2014

(51) Int. Cl.
*H04N 7/18* (2006.01)
*G01D 5/39* (2006.01)
*G01D 9/00* (2006.01)
*G01D 21/00* (2006.01)

(52) U.S. Cl.
CPC *G01D 5/39* (2013.01); *G01D 9/00* (2013.01); *G01D 21/00* (2013.01)

(58) Field of Classification Search
CPC .................................................. G01R 19/2509
USPC ........................................ 348/160; 324/115
See application file for complete search history.

(56) References Cited

U.S. PATENT DOCUMENTS

| 5,640,155 A | * | 6/1997 | Springer | G01R 15/125 324/156 |
| 2009/0128124 A1 | * | 5/2009 | Garland et al. | 324/115 |
| 2009/0140721 A1 | * | 6/2009 | Garland | G01R 19/2509 324/115 |
| 2010/0083729 A1 | * | 4/2010 | Wang | G01D 18/00 73/1.01 |

* cited by examiner

*Primary Examiner* — Tat Chio
*Assistant Examiner* — Masum Billah
(74) *Attorney, Agent, or Firm* — Seed IP Law Group LLP (57) ABSTRACT

In at least one embodiment, a mobile measurement system includes a handheld device, a measurement device, and an optical sensing device. The measurement device and the optical sensing device are communicatively coupled to the handheld device. The handheld device receives measurement data that comprises at least one measured electrical parameter corresponding to a physical property of an external system. The measurement device generates measurement data that corresponds to a period of time. The measurement device communicates the generated measurement data to the handheld device. The optical sensing device generates optical data corresponding to an interface of the measurement device and the external system where the measurement data is being generated. The generated optical data corresponds to a particular time within the measurement period of time. The mobile measurement system associates and stores the generated optical data for the particular time with measurement data corresponding to the period of time.

18 Claims, 7 Drawing Sheets

MEASUREMENT SYSTEM WITH IMAGE CAPTURE CAPABILITIES

BACKGROUND

When performing testing or taking measurements, it is often desirable to record details about the test performed for record keeping and/or future troubleshooting purposes. For example, a technician may perform multiple measurements on various circuits located within or under a large set of equipment. If a test result is not as expected, the technician may need to return to the equipment and take additional measurements to troubleshoot whether a previous measurement was taken correctly. Also, the technician may be limited to using words to describe to a customer, supervisor, or coworker the measurement performed. If, for example, a supervisor or customer wants to verify that the measurement was performed correctly, he or she must manually perform the measurement. Misdiagnosed problems based on faulty measurements can cost time and money.

It would seem possible for a person performing measurements to use a traditional camera to take pictures while performing a particular test. However, in many real world settings, it is often undesirable or not feasible to take pictures of measurements made by test equipment while performing the measurement. A person may need both hands to hold the test equipment, such as measurement probes, in order to perform testing. Such a person does not have a free hand to take pictures of the testing. Also, taking a picture with a camera may be a distraction and actually cause a person to incorrectly perform a measurement or otherwise cause confusion. For example, if a person tries to balance test equipment in order to take a picture of the test equipment, the test equipment could slip and result in an inaccurate setup for the test equipment or produce an inaccurate measurement. Moreover, using presently existing methods it would be difficult, if not impossible, to simultaneously record measurement setting information, measured data, and a photo of the test being performed. Furthermore, many cameras are not designed for use in such settings where testing is performed and would be susceptible to breakage.

Additionally, safety is a great concern when testing and taking measurements, especially in industrial settings. While testing a particular system component, a technician may also need to manually log the results of the measurements in a log book and hold a light to see the system to be measured. Adding the task of taking pictures may further complicate the testing process and could lead to accidents. For example, measurements often need to be taken in tight spaces such as electrical panels or cabinets. It can be quite a challenge to fit measurement equipment into such a space to perform the test. Moreover, using a traditional camera to take pictures of test equipment in such a place could lead to the test equipment causing damage to an electrical system being measured or harming the technician. These problems can be exacerbated if a technician is wearing gloves or other safety equipment that may need to be removed in order to take pictures.

SUMMARY

The following summary is provided to introduce a selection of concepts in a simplified form that are further described below in the Detailed Description. This summary is not intended to identify key features of the claimed subject matter, nor is it intended to be used as an aid in determining the scope of the claimed subject matter.

In at least one embodiment, a mobile measurement system includes a handheld device, a measurement device, and an optical sensing device. The measurement device and the optical sensing device are communicatively coupled to the handheld device. The handheld device is configured to receive measurement data, wherein the measurement data comprises at least one measured electrical parameter corresponding to a physical property of an external system. The measurement device generates the measurement data pertaining to the external system, wherein generated measurement data corresponds to a period of time. The measurement device communicates the generated measurement data to the handheld device. The optical sensing device generates optical data corresponding to an interface of the measurement device and the external system where the measurement data is being generated. The generated optical data corresponds to a particular time within the measurement period of time. The mobile measurement system is further configured to associate and store the generated optical data for the particular time with measurement data corresponding to the period of time.

In at least one embodiment, a method for associating optical data with measurement data comprises generating measurement data using a configurable handheld measurement device, wherein the generated measurement data corresponds to a property of an external system. The method further includes generating optical data corresponding to a particular time in which the measurement data is generated. The generated optical data reflects an interface between the external system being measured and the configurable handheld measurement device. The generated optical data is associated with the generated measurement data.

Furthermore, in at least one embodiment, a mobile measurement device comprises a handheld measurement device, a measurement instrument, and an optical sensing device. The handheld measurement device has a housing, and the measurement instrument and the optical sensing device are coupled to the housing. The measurement instrument generates measurement data corresponding to one or more properties of an external system over a period of time. The optical sensing device generates optical data showing a measurement interface between the measurement instrument and the external system. The generated optical data corresponds to a particular time that is within the period of time. The mobile measurement device is further configured to associate measurement data corresponding to the particular time with the optical data corresponding to the particular time. A plurality of measurement settings are included with the mobile measurement device. The measurement data is further associated with a particular measurement setting of the measurement device.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

In various embodiments, disclosed herein are systems and methods that provide for generating optical data corresponding to a physical arrangement of a measurement device and an external system being measured by a measurement system, and for associating measurement data with the optical data. The disclosed systems and methods allow for remote troubleshooting, aid in verifying a correct setup, and help in eliminating operator error as a cause of unexpected measurement results. In at least one exemplary embodiment, the optical data may be generated by an optical sensor in the measurement system, which could include camera lens and a charge-coupled device (CCD). The optical data may be combined by the measurement system with measurement data and/or setting data to form an image. The optical data, measurement data, or image may be transferred to another device to allow for review of test results and troubleshooting from a remote location.

Figure 1:
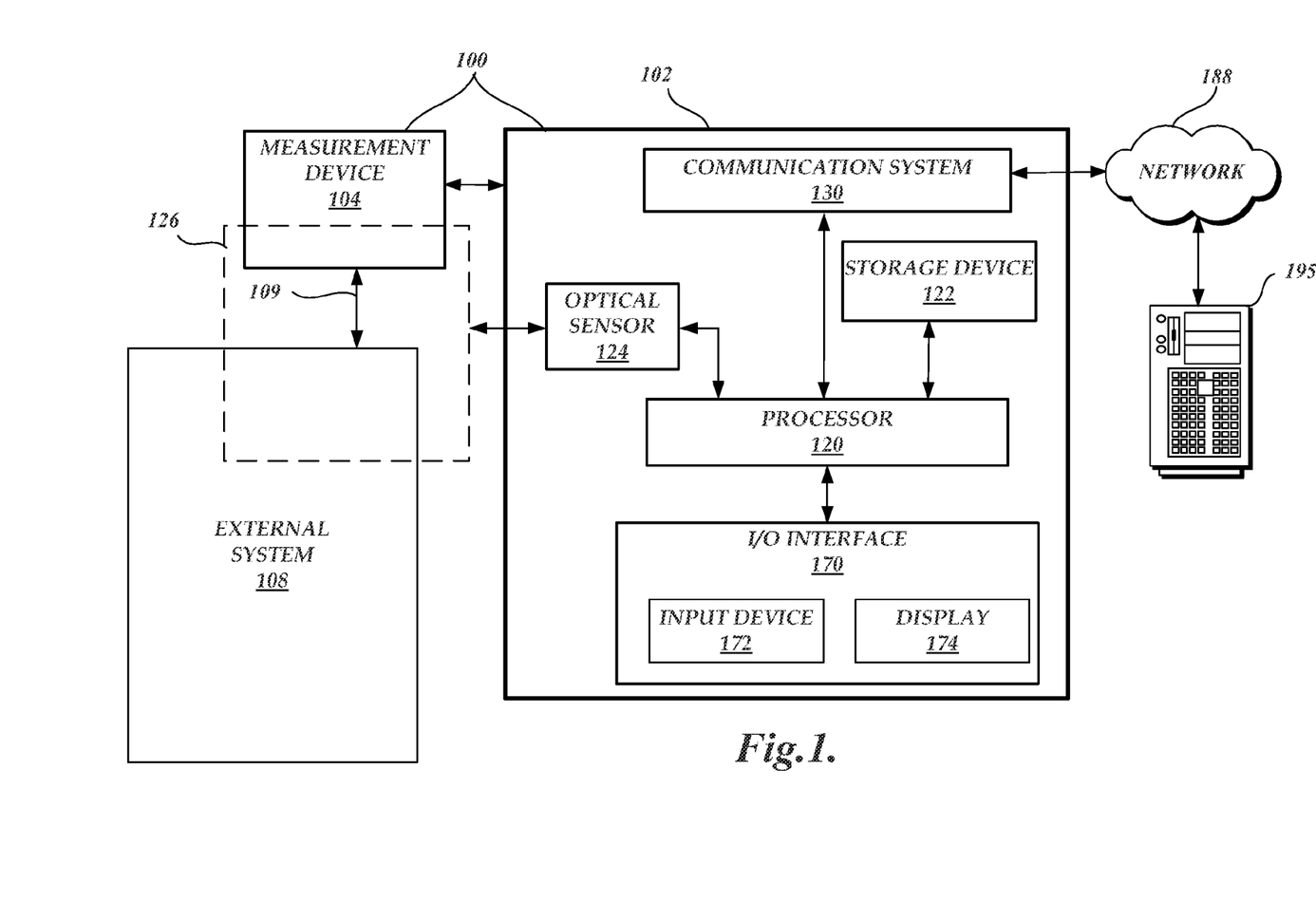
FIG. 1 illustrates a block diagram of an exemplary mobile measurement system.

FIG. 1 illustrates a block diagram of a mobile measurement system 100. The mobile measurement system 100 is only one example of a suitable mobile measurement system and is not intended to suggest any limitation as to the scope of use or functionality of the disclosed embodiments. The mobile measurement system 100 includes a handheld device 102 that may include a measurement device 104. In various embodiments, the handheld device 102 may be, for example, a digital multimeter (DMM), WiFi network tester, vibration tester, or an IR thermometer. However, the handheld device 102 could include any type of mobile testing/measurement device or could be a multipurpose device capable of performing a combination of types of measurement devices. A handheld system or device as described herein includes one or more devices generally configured to be holdable in a user's hand while taking a measurement. However, it should be appreciated that the system or device need not always be held in a user's hand and may be positioned by a user to not be held, for example, by affixing or hanging the system or device from a support or from a machine.

The handheld device 102 includes a processor 120, a storage device 122, an optical sensor 124, a communication system 130, and an I/O interface 170. The processor 120 serves as the computational center of the handheld device 102 by supporting the execution of instructions. The processor 120 may include an image processor for processing optical data. The storage device 122 further includes one or more forms of computer-readable storage media. Computer-readable storage media includes any currently available or later developed storage media suitable for storing programs and data that is accessible by one or more device components, such as the processor 120. Computer-readable storage media may be removable or non-removable and may be volatile or non-volatile. Examples of computer-readable storage media includes hard drives as well as RAM, ROM, EEPROM, and flash types of memory.

Communication system 130 includes one or more components for communicating with an external device 195 using a network 188. In some embodiments, communication system 130 may also include one or more components capable of communicating with the measurement device 104. All such communication may be wired or wireless.

The I/O interface 170 includes an input device 172 and a display 174. The I/O interface 170 may include any device that allows a user or an external system to interact with the processor 120 and any device that allows the processor 120 to display information, such as images. In at least one embodiment, the I/O interface 170 allows a user to control or configure the measurement device 104 to perform a particular measurement or to request particular data from the measurement device 104. As discussed in more detail below, information regarding the particular configuration of mobile measurement system 100 may be stored in the storage device 122 and is referred to herein as "setting data." The display 174 may be, for example, a liquid crystal display (LCD) device. Preferably, the display 174 is capable of displaying color images, though embodiments disclosed herein can also be made to work with black and white displays. In some embodiments, the display 174 includes a touch screen which provides for the input device 172 to be incorporated into the display 174. In response to an input by the input device 172, the handheld device 102 may display information or data related to a specific measurement. As discussed in more detail below, the display 174 may display an image corresponding to optical data received by the optical sensor 124.

Input device 172 may include a single input device or a combination of input devices configured to communicate an input to the handheld device 102. Input device 172 may include, as examples, buttons, a keypad, a touchpad, switches, trigger switches, selectors, a rotary switch, or other known input devices. As mentioned above, the input device 172 may be incorporated into the display device 174 as a touch screen. In at least one embodiment, the handheld device 102 is configured to perform a particular type of measurement in response to a user input or selection that is input to the input device 172. The particular measurement configuration may be configurable by modifying measurement setting data of the input device 172. In embodiments of the present disclosure, setting data may be associated with particular measurement data and stored in the storage device 122. In one example, if a user presses a particular button of the input device 172, it may configure the type of measurement performed by the handheld device 102. In an exemplary embodiment, if a particular button is pressed, the optical sensor 124 responds by sensing optical data.

As examples, the measurement device 104 may be electrical test leads, an IR transmitter/receiver module, or a WiFi testing module. However, the measurement device 104 may be any device capable of generating measurement data pertaining to a particular system. As will be better understood from the following description, as used herein, the term measurement data refers to data that directly or indirectly relates to a measured property. In other words, the term measurement data may include data that requires processing to be converted into a standard measured property. In a specific embodiment, measurement data includes an electrical parameter corresponding to at least one property of the external system 108. Properties may include, for example, vibration, humidity, pressure, temperature, and decibels.

Measurement data may also include data that is used to derive a property of a particular system. The measurement device 104 may include a measurement instrument such as probes or leads and wires suitable for use with an electronic device such as a DMM. In another embodiment, the measurement device 104 could include a measurement instrument such as an infrared (IR) transmitter and receiver that is used with part of IR temperature measurement tool.

The measurement device 104 may be located proximate to or remotely from the handheld device 102. In some embodiments, the measurement device 104 may be communicatively coupled to the handheld device 102 over a wireless path. For example, the measurement device 104 could include a measurement module such as a CNX 3000 test tool made by Fluke Corporation. The measurement device 104 may include more than one measurement module. In other words, in some embodiments, the measurement device 104 could include a plurality of CNX 3000 test tools. The measurement device 104 may communicate measurement data to the handheld device 102 over the wireless path. In some embodiments, the measurement device 104 may include a processor and may process measured data into a different form and pass the processed measurement data to the handheld device 102. In some embodiments, the measurement device 104 is attached to a housing containing the handheld device 102. In some embodiments, at least a portion of the measurement device 104 is contained within the housing.

The optical sensor 124 may include any type of optical sensing device capable of receiving optical data. The optical sensor 124 may include a camera, a video camera, or other type of optical sensing device that is currently known or later developed. In some embodiments, the optical sensor 124 is attached to the handheld device 102 and is communicatively coupled to the processor 120. The optical sensor 124 may include a light or flash to improve its optical sensing capabilities. In some embodiments, the optical sensor 124 may be adjustable. The optical sensor 124 may be adjusted manually or by using a motor. Preferably, the optical sensor 124 is configured to provide optical data in the spectrum viewable by humans; however, the optical sensor may provide optical data corresponding to a broader spectrum, which may be subsequently processed or filtered.

External system 108 is a system having one or more measurable properties. The system 108 is external to the measurement device 104. As examples, external system 108 could be a circuit in an electrical panel, a series of pipes carrying chemicals, or a wireless signal at a particular location. Various properties of the external system may be determined using the systems and methods of the present disclosure. The measurement device 104 is operable to measure a property of the external system 108.

Optical image data 126 refers to an image derived from optical data generated by the optical sensor 124 that indicates a measurement interface 109. The measurement interface 109 is the physical arrangement at a point of interaction between the mobile measurement system 100 and the external system 108. As shown in FIG. 1, the optical image data 126 preferably includes at least a portion of the measurement device 104 and a portion of the external system 108 being measured. In some embodiments, the measurement interface 109 is indicated implicitly by the optical image data 126. For example, in an embodiment involving a WiFi measurement tool using an antenna, the optical image data 126 may include an image from the perspective of the antenna. If the antenna of the WiFi measurement tool is known to be located near the optical sensor, the arrangement of the measurement device 104 is implicitly indicated by the image from the perspective of the antenna. The optical image data 126 does not need to explicitly show the point of interaction between the measurement device 104 and the external system 108. It may be desirable to process or filter the optical image data obtained by the optical sensor 124. Accordingly, the terms optical image data and optical data include optical image data or optical data that has been processed or filtered or is otherwise derived from the original optical data.

External device 195 is a device capable of receiving data transmitted from the handheld device 102. Data from the handheld device 102 may be transmitted using communication system 130 through a network 188 to the external device 195. As examples, the external device 195 may be a computing device such as a laptop computer, desktop computer, tablet computer, smart phone, PDA, or a server. The network 188 may utilize any wired or wireless networking technology known or later developed such as WiFi, Bluetooth, 3G, 4G, or a proprietary wireless signal. As examples, the network 188 may be configured as a Wide Area Network (WAN), a Personal Area Network (PAN), or a Local Area Network (LAN). In an exemplary embodiment, the measurement data may be part of an email or SMS text transmitted from the handheld device 102 to the external device 195. External device 195 may allow for measured data to be viewed and processed remotely, which allows for improved remote troubleshooting.

Figure 2:
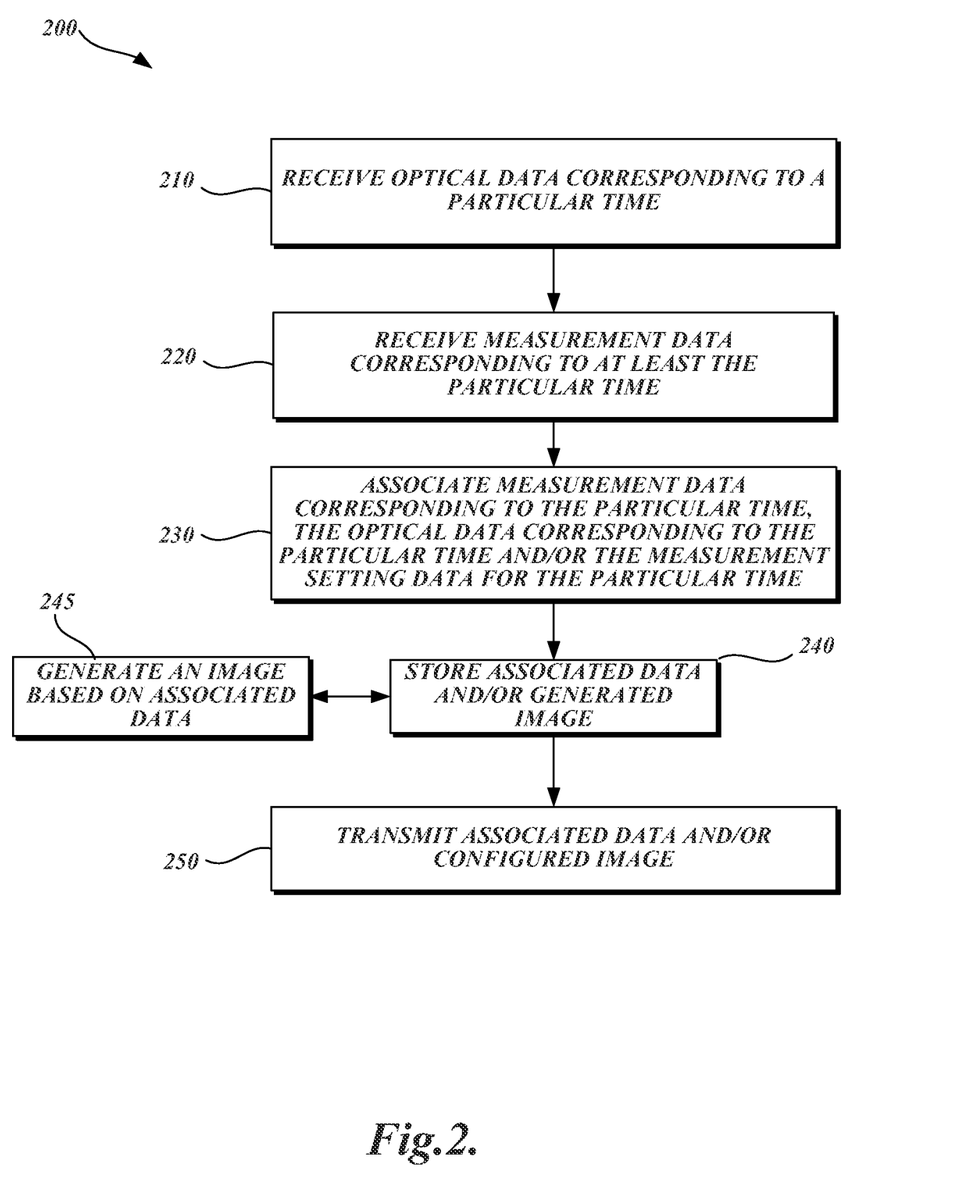
FIG. 2 illustrates a process that may be performed by the mobile measurement system illustrated in FIG. 1.

FIG. 2 illustrates a process 200 that may be performed by the measurement system 100. At block 210, the mobile measurement system 100 receives and/or generates optical data corresponding to a particular time. The particular time may be based on an internal clock of the handheld device 102 and/or might be based on user-configured time and date. The optical data is generated by the optical sensor 124. After receiving the optical data, the handheld device 102 may associate the optical data with the particular time and store the associated data in the storage device 122. At block 220, the handheld device 102 receives measurement data corresponding to at least the particular time mentioned above in connection with block 210. The measurement data may be received from the measurement device 104. The measurement data may include data corresponding to a broad period of time. The measurement data may be associated with the appropriate time period and stored in the storage device 122. Preferably, the optical data is time-matched to the measurement data and/or the setting data. At block 230, the time-matched optical data, setting data, and measurement data are associated with one another. At block 240, the associated data may be stored in the storage device 122.

The associated data may be retrieved from the storage device 122, preferably by the processor 120. At block 245, the processor 120 generates an image based on the optical data and, optionally, the setting data and/or the measurement data. In at least one embodiment, an image is generated based on the image data and the image data is associated with the measurement data and/or the setting data. The processor 120 may generate an overall image by overlaying two or more images. For example, an image corresponding to a textual representation of the measurement data may be generated and combined with a pictorial image generated based on the optical data. The process 200 may return to block 240 to store the generated image in the storage device 122.

At block 250, data may be transmitted to another device such as the external device 195. For example, image data generated in block 245 and/or any of the associated data may be transmitted at block 250. Transmitting the data may occur automatically or may require a positive action in the system 100 to initiate a transmission.

Figure 3:
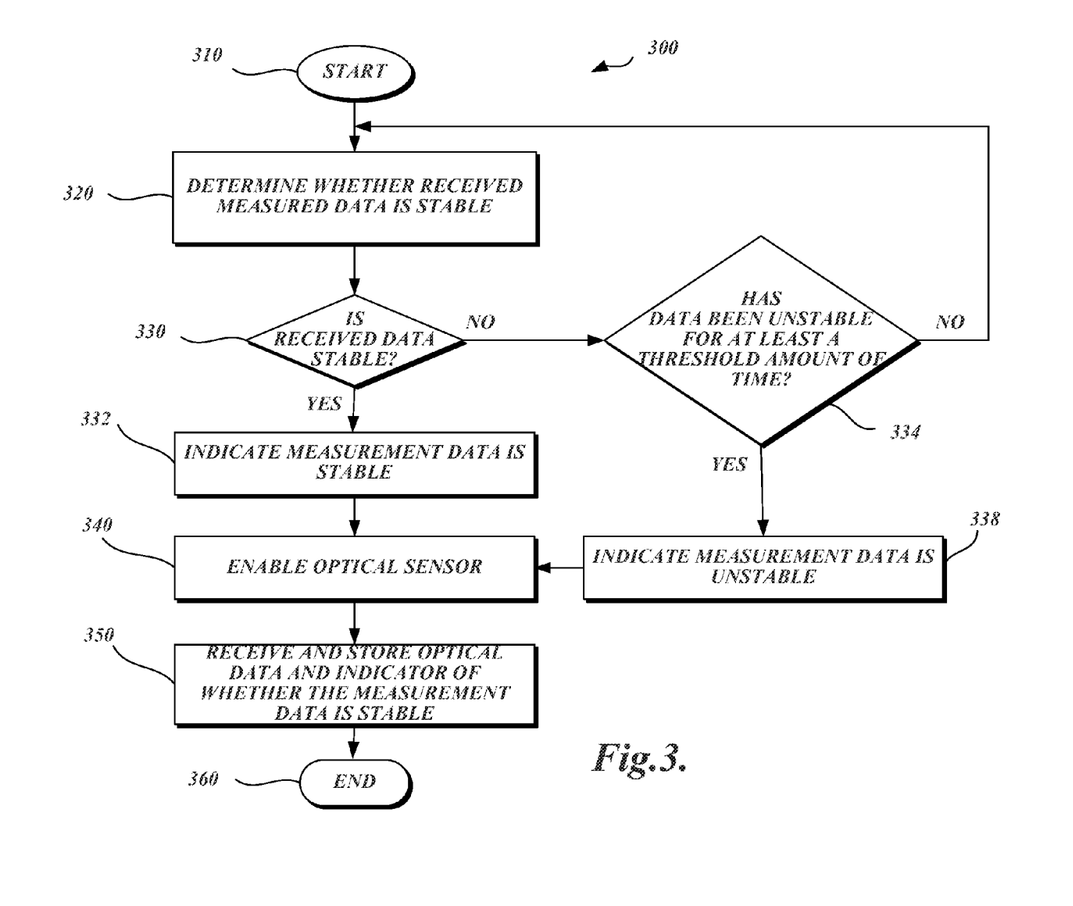
FIG. 3 illustrates another process that may be performed by the mobile measurement system.

FIG. 3 illustrates another process 300 that may be performed by the mobile measurement system 100. In general, the process 300 prevents a user from generating optical data when the received measurement data is unstable because it may lead to confusion. However, if the received measurement data continues to be unstable, the optical sensor may be enabled to generate optical data to record the situation and help determine a solution.

The process 300 is initiated at block 310. In at least one embodiment, the optical sensor is initially disabled at 310. At block 320, the mobile measurement system 100 determines if the received measured data is stable. Stability of measurement data refers to an acceptable, consistent reading and depends on the measurement being performed. A variety of tests or checks known to those of ordinary skill in the art may be performed by the measurement system to determine stability of the measurement data. At block 330, a test or check is performed as to the stability of the measurement data. If at block 330 the test or check determines that the received data is stable, the process proceeds to block 332 where an indication of stability may be stored in the storage device 122. At block 340, the measurement system 100 activates the optical sensor 124.

Returning to block 330, if the received data is not stable, the process 300 continues to block 334 where a test or check is performed as to whether the received data has been unstable for at least a threshold period of time. The specific threshold period of time may be selected by the user or may be a default value for the mobile measurement system 100. If the threshold time period has not been met, the process 300 returns to block 320. If at block 334, the threshold has been met, the data is indicated to be unstable at block 338. At block 340, the optical sensor is enabled and optical data is generated. At block 350, the generated optical data is received and stored along with an indicator of whether the measurement data is stable. The process 300 terminates at block 360.

Figure 4:
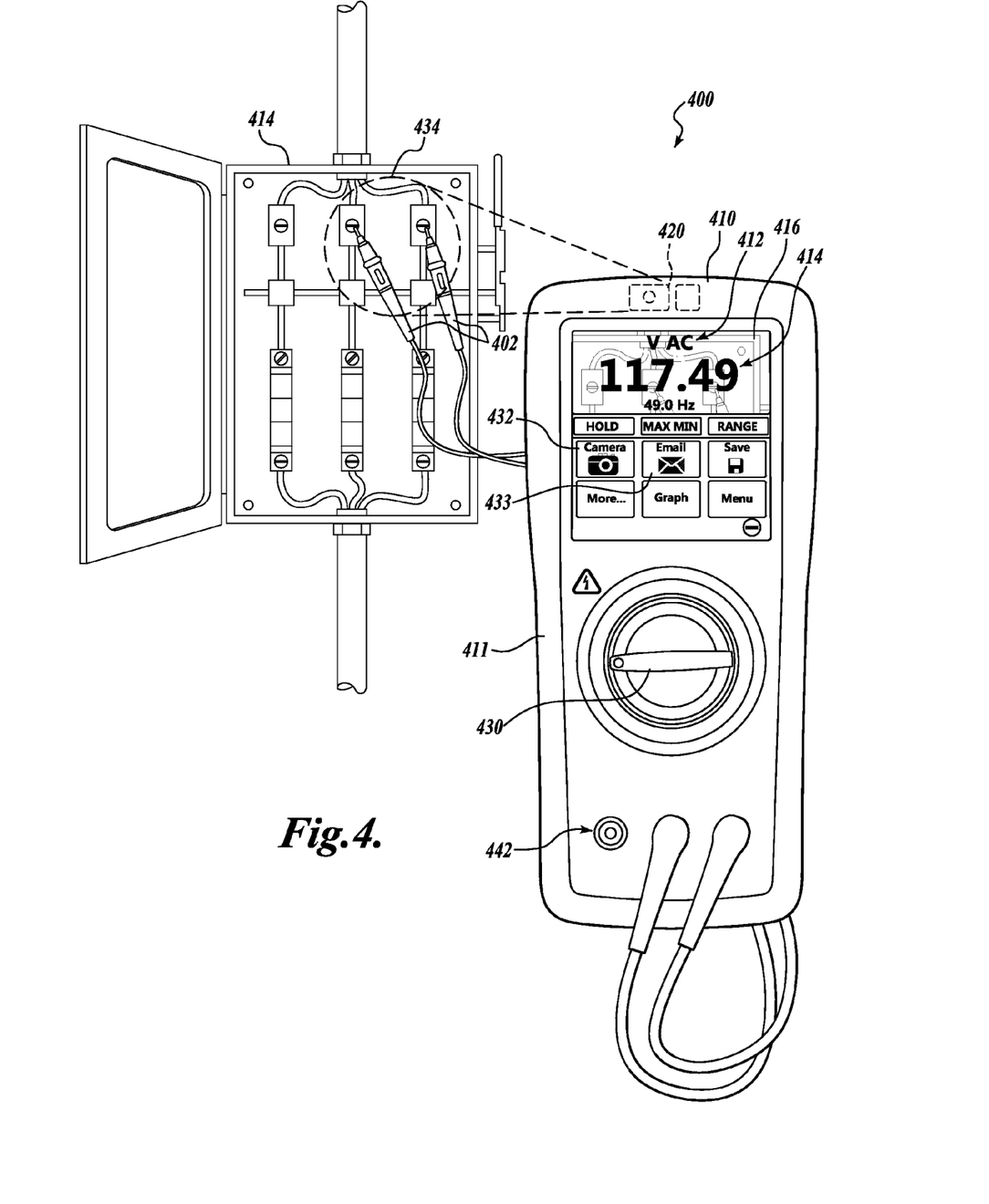
FIG. 4 illustrates an exemplary embodiment of a mobile measurement system.

FIG. 4 illustrates an exemplary embodiment of a mobile measurement system 400. The mobile measurement system 400 includes a handheld DMM device 410 that is electrically coupled to test leads 402. The handheld DMM device 410 includes a housing 411. A lead junction 442 is located within the housing 411. Thus, the test leads 402 are connected to the DMM. An optical sensor 420 is included in the housing 411. In some embodiments, it may be desirable to keep the optical sensor 420 within the housing to protect the optical sensor from damage. In other embodiments, a detachable or extendable optical sensor 420 may be desirable, particularly to image hard-to-reach equipment being measured. The test leads 402 are coupled to a portion of an external system 414. Measurement interface 434 shows the physical arrangement at a point of interaction between the mobile measurement system 400 and the external system 411.

The exemplary handheld DMM device 410 includes a rotary switch 430 and a touch screen 431 as input devices 172. The touch screen 431 includes a camera button 432 for initiating optical data generation. The touch screen also includes an email button 433 which, if pressed, would attempt to transmit measurement data and/or optical data to an external device 195 by electronic message or email. Measurement data 414 is shown on a display 416. In this embodiment, a preview image is also displayed on the display 416. The preview image displayed on the display 416 is derived from the optical data sensed by the optical sensor 420. Setting data 412 is also included on the touch screen display 431. In this embodiment, setting data 412 is data associated with the configuration of the handheld DMM device. Specifically, "V AC" refers to the measurement selected using the rotary switch 430. In some cases, setting data could also be measurement data. For example, V AC could also be the units of the measured data 414.

Figure 5:
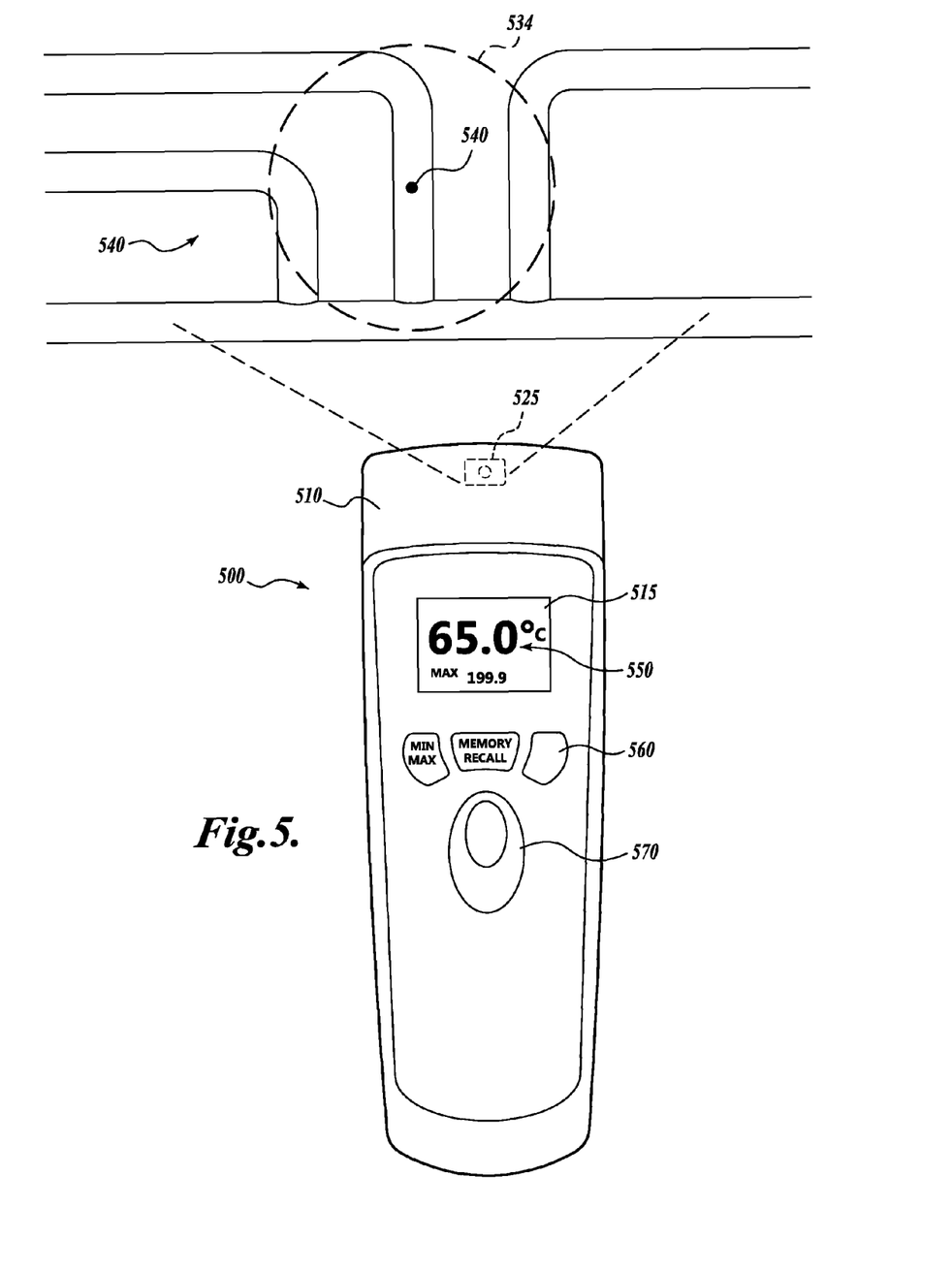
FIG. 5 illustrates an exemplary embodiment of another mobile measurement system.

FIG. 5 illustrates another exemplary embodiment of a mobile measurement system 500. Mobile measurement system 500 includes an IR thermometer device 510. The IR thermometer device 510 projects a beam 520 onto a pipe of an external system 540. The beam 520 and its reflections indicate a location corresponding to measurement data 550. The measurement data 550 is displayed on a display 515 and includes a temperature value. In this embodiment, the display 515 is not configured to display optical image data 126. Though in other embodiments, the optical image data 126 may be included in the display 515.

The IR thermometer device 510 includes an optical sensor 525, a camera button 560, and a trigger 570. The camera button 560 may be used to initiate the optical sensor 525. Trigger 570 is used to initiate a measurement (i.e., temperature). In some embodiments, if the trigger 570 is pressed for a threshold period of time, the optical sensor 525 is automatically initiated. Preferably for an IR thermometer tool, the optical sensor 525 is configured to sense data from the same direction as the beam 520 such that optical data received by the optical sensor 525 would include a measurement interface 534 that explicitly shows the beam 520 reflecting at a point of the external system 540.

Figure 6:
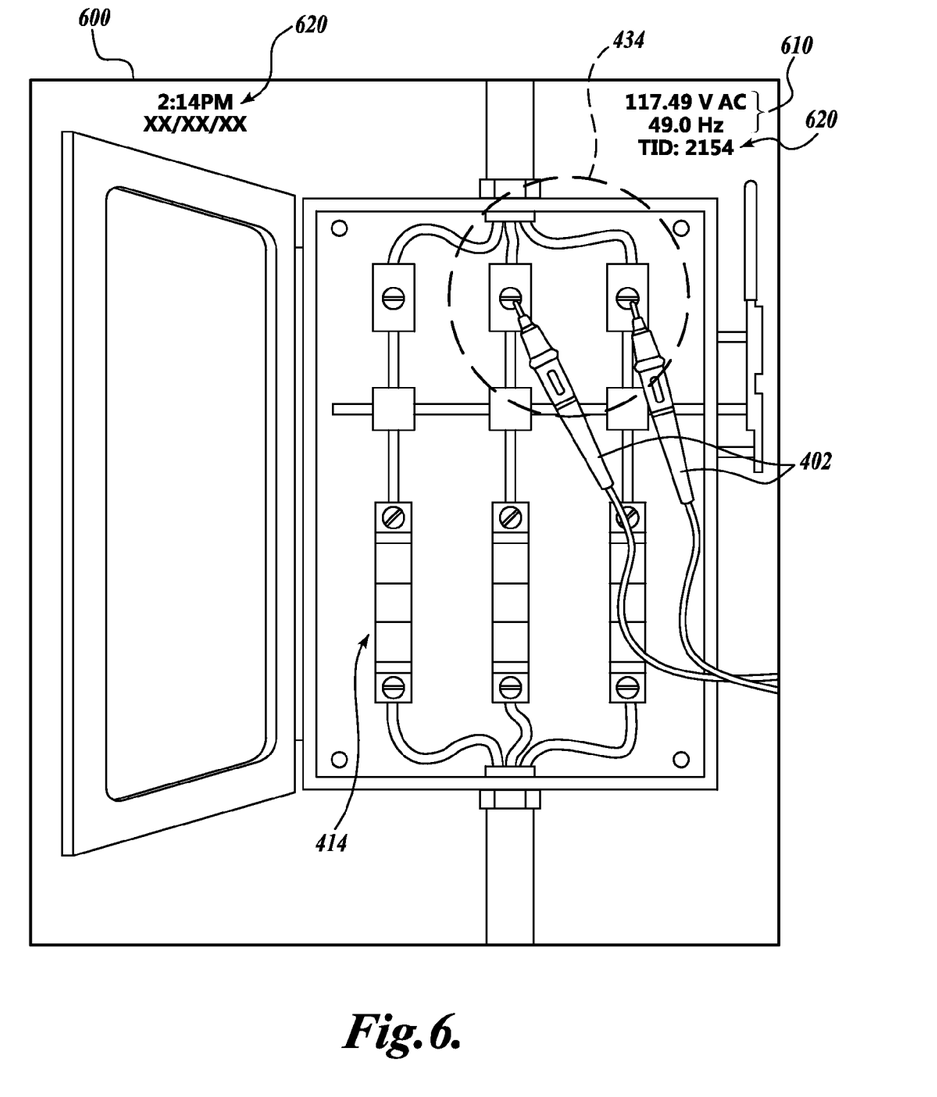
FIG. 6 illustrates an image that might be generated by the mobile measurement system illustrated in FIG. 4.

FIG. 6 illustrates an exemplary image 600 generated by the mobile measurement system 400 shown in FIG. 4. Image 600 is preferably a color image. The image 600 includes setting data 620 ("TID"). TID refers to a technician identifier which is preferably input into the mobile measurement system 400 by the user and may be used to identify the technician or person that performed a measurement. The image 600 includes a textual representation of setting data 620 and a textual representation of measurement data 610. Image 600 also includes the measurement interface 434 that explicitly shows the test leads 402 in contact with the external system 414. If the measurement data has been determined to be unstable, an indicator such as '!' may be added to the image 600.

Figure 7:
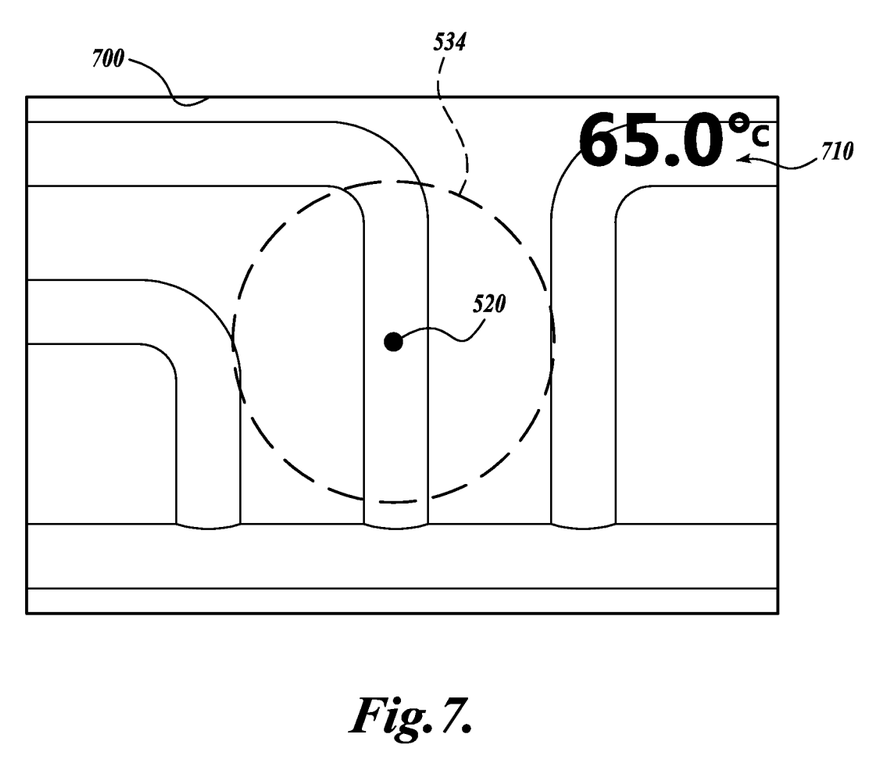
FIG. 7 illustrates an image that might be generated by the mobile measurement system illustrated in FIG. 5.

FIG. 7 illustrates an exemplary image 700 generated by the mobile measurement system 500 shown in FIG. 5. A textual representation 710 of the measurement data shown in FIG. 5 is included in the image 700. The image 700 also includes the measurement interface 534 that shows the point of interaction between the measurement system 500 and the external system 540, which is indicated by the beam 520.

While various illustrative embodiments have been illustrated and described, it will be appreciated that various changes can be made therein without departing from the spirit and scope of the invention.

The embodiments of the invention in which an exclusive property or privilege is claimed are defined as follows:
1. A mobile measurement system comprising:
   a handheld device configured to receive measurement data pertaining to a measurement of an external system, wherein the received measurement data comprises at least one measured electrical parameter corresponding to a physical property of the external system;
   a measurement device communicatively coupled to the handheld device, wherein the measurement device is configured to measure the physical property of the external system and generate the measurement data, wherein the generated measurement data corresponds to a period of time, and wherein the measurement device communicates the generated measurement data to the handheld device; and an optical sensing device communicatively coupled to the handheld device, wherein the optical sensing device generates optical data depicting an image of a physical interface of the measurement device and the external system where the measurement device is measuring the physical property of the external system, wherein the generated optical data corresponds to a particular time within the period of time, and wherein the mobile measurement system is further configured to associate and store the generated optical data corresponding to the particular time with the measurement data corresponding to the period of time.

2. The mobile measurement system of claim 1, wherein the mobile measurement system is further configured to generate a first image from the generated optical data.

3. The mobile measurement system of claim 2, wherein the mobile measurement system is further configured to generate a second image comprising a textual representation of at least a portion of the measurement data that is associated with the generated optical data.

4. The mobile measurement system of claim 2, wherein the mobile measurement system is further configured to transmit at least the first image and the associated measurement data to another device.

5. The mobile measurement system of claim 2, wherein the mobile measurement system is further configured to activate the optical sensing device after a threshold condition has occurred.

6. The mobile measurement system of claim 5, wherein the mobile measurement system is further configured to determine whether the measurement data received by the handheld device is stable, and wherein the threshold condition is that the received measurement data is stable.

7. The handheld device of claim 1, wherein the handheld device is further configured to store and associate with the optical data at least one of the particular time, a technician identifier, settings data, a date, and whether the measured data associated with the optical data is stable.

8. A method for associating optical data with measurement data, the method comprising:
applying a configurable handheld measurement device to an external system and generating measurement data using the configurable handheld measurement device, wherein the generated measurement data corresponds to a measured property of the external system;
generating optical data using an optical sensing device, wherein the generated optical data corresponds to a particular time in which the measurement data is generated, and wherein the generated optical data depicts an interface between the external system being measured and the configurable handheld measurement device where the handheld measurement device is applied to the external system; and
associating the generated optical data with the generated measurement data.

9. The method of claim 8, further comprising:
generating a first image based on the generated optical data;
generating a second image that includes a textual representation of at least a portion of the measurement data associated with the optical data; and
combining the first image with the second image to form a combined image.

10. The method of claim 9, further comprising determining whether the measurement data is stable.

11. The method of claim 10, further comprising adding an indication of whether the optical data is stable to the combined image.

12. The method of claim 10, further comprising generating optical data only after one of: (1) the measurement data is determined to be stable; or (2) the measurement data has been determined to be unstable for at least a threshold period.

13. The method of claim 8, further comprising transmitting the associated measurement data and optical data to another device.

14. A mobile measurement device comprising:
a measurement instrument configured to measure one or more properties of an external system and generate measurement data corresponding to the one or more properties of the external system; and
an optical sensing device configured to generate optical data showing a measurement interface between the measurement instrument and the external system, wherein the generated optical data corresponds to a particular time at which the measurement data is generated and depicts the external system where the measurement instrument is measuring the one or more properties of the external system,
wherein the mobile measurement device is configured to associate measurement data corresponding to the particular time with the optical data corresponding to the particular time,
wherein the mobile measurement device includes a plurality of measurement settings, and
wherein the measurement data is further associated with a particular measurement setting of the mobile measurement device.

15. The mobile measurement device of claim 14, wherein the mobile measurement device is further configured to generate an image based on the generated optical data.

16. The mobile measurement device of claim 15, wherein the mobile measurement device is further configured to generate and add a representation of at least a portion of the measurement data to the image.

17. The mobile measurement device of claim 16, wherein the mobile measurement device is further configured to generate and add a representation of at least a portion of the particular measurement setting to the image.

18. The mobile measurement device of claim 16, wherein the mobile measurement device is further configured to automatically transmit the image to an external device.

* * * * *